(12) United States Patent
Liu et al.

(10) Patent No.: US 9,913,338 B2
(45) Date of Patent: Mar. 6, 2018

(54) LIGHT-EMITTING DEVICE WITH TEMPERATURE COMPENSATION

(71) Applicant: EPISTAR CORPORATION, Hsinchu (TW)

(72) Inventors: Hsin-Mao Liu, Hsinchu (TW); Zong-Xi Chen, Hsinchu (TW); Min-Hsun Hsieh, Hsinchu (TW); Chien-Yan Wang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 414 days.

(21) Appl. No.: 13/957,139

(22) Filed: Aug. 1, 2013

(65) Prior Publication Data

US 2013/0314001 A1 Nov. 28, 2013

Related U.S. Application Data

(63) Continuation-in-part of application No. 13/759,735, filed on Feb. 5, 2013, which is a continuation-in-part of application No. 13/192,997, filed on Jul. 28, 2011, now abandoned.

(51) Int. Cl.
*H05B 33/08* (2006.01)
*H01L 25/16* (2006.01)
*H01L 27/15* (2006.01)

(52) U.S. Cl.
CPC ..... *H05B 33/0854* (2013.01); *H05B 33/0872* (2013.01); *H01L 25/167* (2013.01); *H01L 27/153* (2013.01); *H01L 2924/0002* (2013.01)

(58) Field of Classification Search
CPC .................................. H05B 33/0854
See application file for complete search history.

(56) References Cited

U.S. PATENT DOCUMENTS

| 7,081,722 | B1 | 7/2006 | Huynh | |
|---|---|---|---|---|
| 9,210,767 | B2 | 12/2015 | Chang et al. | |
| 2005/0269591 | A1* | 12/2005 | Hsin Chen | H01L 33/641 257/99 |
| 2007/0171159 | A1* | 7/2007 | Lee | H05B 33/0857 345/83 |
| 2008/0083929 | A1 | 4/2008 | Fan et al. | |
| 2008/0094000 | A1* | 4/2008 | Yamamoto | H05B 33/0803 315/250 |

FOREIGN PATENT DOCUMENTS

| CN | 101009080 A | 8/2007 |
|---|---|---|
| CN | 101668373 A | 3/2010 |

OTHER PUBLICATIONS

Peter R. N. Childs, Practical Temperature Measurement, Oct. 2001, Butterworth-Heinemann, pp. 182-183.*

* cited by examiner

*Primary Examiner* — Kenneth Parker
*Assistant Examiner* — Christopher Culbert
(74) *Attorney, Agent, or Firm* — Muncy, Geissler, Olds & Lowe, P.C.

(57) ABSTRACT

The present application provides a light-emitting device comprising a first light-emitting diode group; a second light-emitting diode group electrically connected to the first light-emitting diode group in parallel; and a temperature compensation element electrically connected to the second light-emitting diode group in series; and a first switch device connected between the second light-emitting diode group and the temperature compensation element.

14 Claims, 21 Drawing Sheets

LIGHT-EMITTING DEVICE WITH TEMPERATURE COMPENSATION

REFERENCE TO RELATED APPLICATION

This application is a continuation-in-part of U.S. patent application Ser. No. 13/759,735, entitled "Light-emitting device with temperature compensation", filed on Feb. 5, 2013, which is also a continuation-in-part of U.S. patent application Ser. No. 13/192,997, entitled "Light-emitting device with temperature compensation", filed on Jul. 28, 2011. The entire contents of each of these applications are hereby incorporated in its entirety by reference.

TECHNICAL FIELD

The application relates to a light-emitting device, and more particularly, to a light-emitting device with temperature compensation.

DESCRIPTION OF BACKGROUND ART

That the incandescent lamp shines is because of heat. On the contrary, the lighting mechanism of light-emitting diode (LED) is due to the recombination of the electron-hole pair. Therefore, LED is called the cold light source.

Further, LED has the advantages of high durability, long life, light weight, and low power consumption; therefore, LED is considered as a new light source of next generation LED has gradually replaced traditional lightings to date. LED has widely used in various fields such as traffic signal, backlight module, street lighting, and medical equipment.

In the application of general lighting, the sunlight-like spectrum (white light) emitted from LED is highly appreciated in terms of human biological adaptabilities. The white light described above can be generated by mixing the three primary colors of red, blue, and green emitted from LEDs in a specific ratio through different operating currents from carefully-design circuit drivers. Because not only the cost of circuit drivers is high but also the circuit design is complicated, the method is not well-adopted. Another method employs ultraviolet light-emitting diode (UV-LED) to excite red, blue, and green phosphors capable of absorbing a part of light emitted by UV-LED and emitting the red color light, the blue color light, and the green color light. The red color light, the blue color light, and the green color light are mixed to generate the white light. Nevertheless, the luminous efficiency of UV-LED still needs to be improved so the application of the product is not widespread.

When the electric current drives the LED, in addition to the electric energy-photo energy conversion mechanism, part of the electric energy is transformed into the thermal energy, thus causing changes in the photoelectric characteristics. FIG. 1 illustrates the curve of the photoelectric characteristics of blue light LED and red light LED when the junction temperature ($T_j$) of the LED is increased from 20° C. to 80° C. As shown in FIG. 1, the vertical axis represents the relative value of the photoelectric characteristic value at different junction temperatures compared with that at 20° C. junction temperature of the light emitting device, such as light output power ($P_O$; rhombus symbol), wavelength shift ($W_d$; triangle symbol), and forward voltage ($V_f$; square symbol). The solid line shown in FIG. 1 represents the characteristic curve of the blue light LED, and the dotted line shown in FIG. 1 represents the characteristic curve of the red light LED. When the junction temperature is increased from 20° C. to 80° C., the light output power of the blue light LED drops about 12% and the hot/cold factor is about 0.88; the light output power of the red light LED drops about 37% and the hot/cold factor is about 0.63. Furthermore, in terms of the wavelength shift, there is no big difference between the blue light LED and the red light LED but is only slightly changed with the difference of $T_j$. In terms of the forward voltage changes, when the junction temperature is increased from 20° C. to 80° C., the decline of the blue light LED and the red light LED is respectively about 7~8%. Namely, the equivalent resistances of the blue light LED and the red light LED decline about 7~8% under the operation of constant current. As mentioned above, because the temperature dependences of the blue light LED and the red light LED photoelectric characteristics are different, the undesirable phenomenon of the unstable red/blue light output power ratio happens during the period from the initial operation to the steady state. When the Warm white light-emitting device comprising the red light LED and the blue light LED is used in the lighting field, the light color instability during the initial state and the steady state owing to the different hot/cold factors of the blue light LED and the red light LED causes the inconvenient when using the lighting.

SUMMARY OF THE APPLICATION

The present application provides a light-emitting device. The light-emitting device comprises: a first light-emitting diode group; a second light-emitting diode group electrically connected to the first light-emitting diode group in parallel; and a temperature compensation element electrically connected to the second light-emitting diode group in series; and a first switch device connected between the second light-emitting diode group and the temperature compensation element.

DETAILED DESCRIPTION OF PREFERRED EMBODIMENTS

Figure 1:
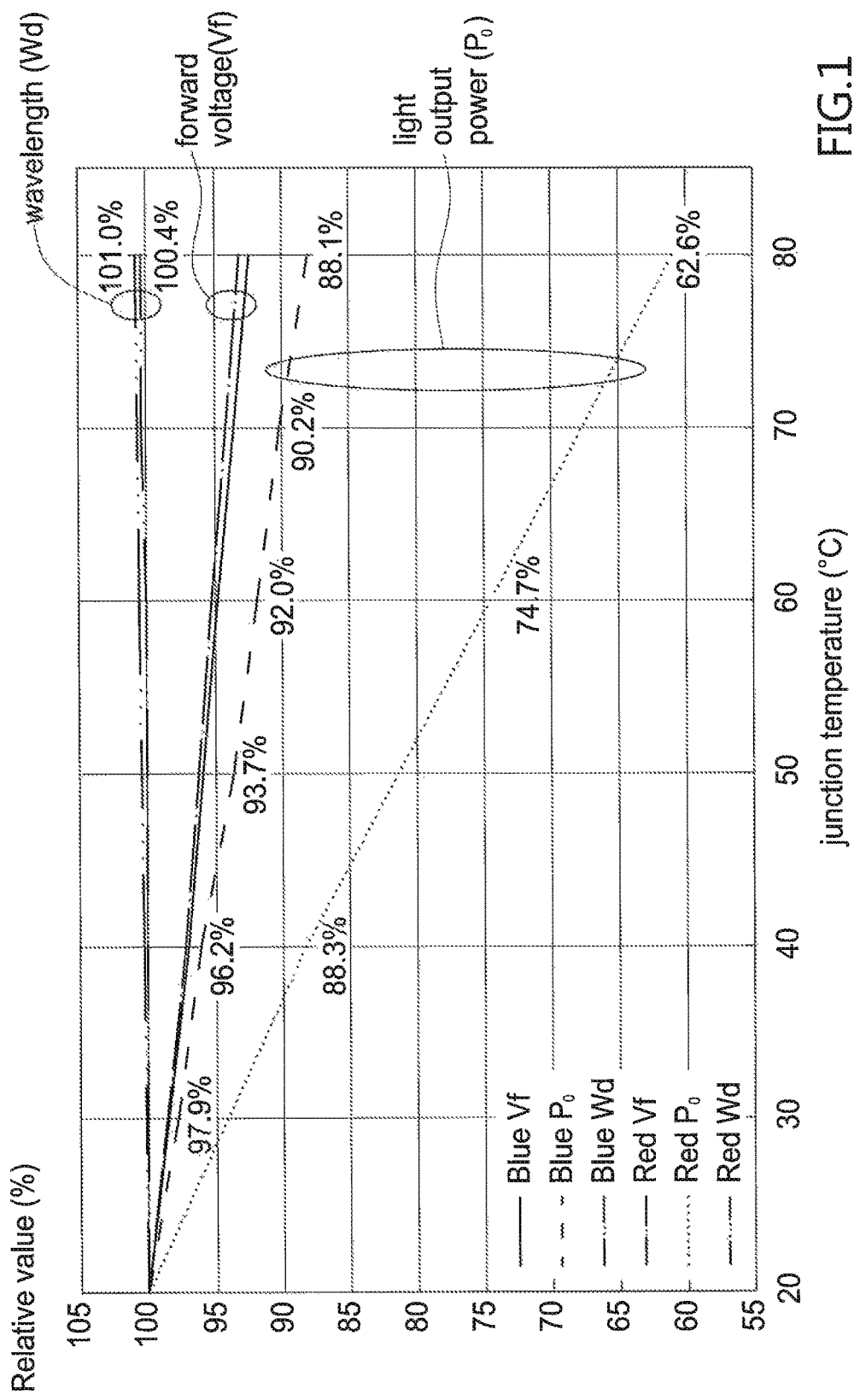
FIG. 1 illustrates the relationship curve between the junction temperature and the photoelectric characteristics of blue light LED and red light LED light-emitting devices.

The embodiments of the present application are illustrated in detail, and are plotted in the drawings. The same or the similar part is illustrated in the drawings and the specification with the same number.

Figure 2A:
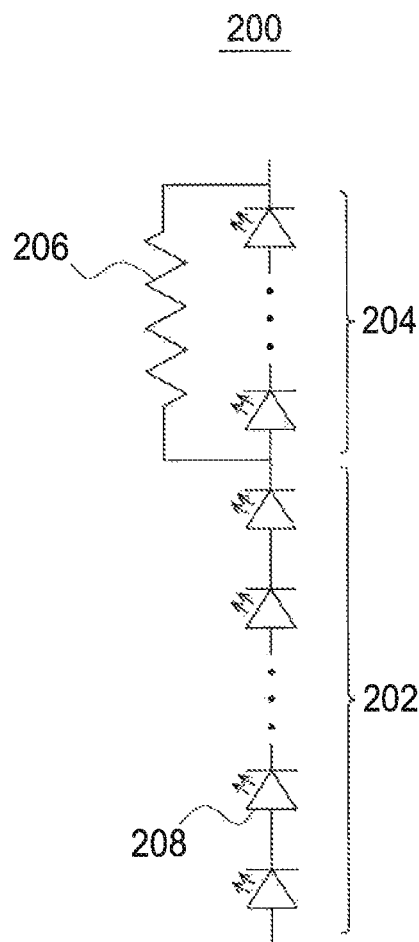
FIG. 2A is a diagram of the light-emitting device in accordance with the first embodiment of the present application.

FIG. 2A illustrates an electric circuit diagram of the light-emitting device in accordance with the first embodiment of the present application. The light-emitting device 200 comprises a first light-emitting diode group 202, a second light-emitting diode group 204, and a temperature compensation element comprising a first resistor, for example a thermistor 206 with positive temperature coefficient of resistance (PTC). The first light-emitting diode group 202 comprises a first quantity of light-emitting diode units 208 connected to one another in series, the second light-emitting diode group 204 comprises a second quantity of light-emitting diode units 208 connected to one another in series, and the first light-emitting diode group 202 is electrically connected to the second light-emitting diode group 204 in series. The light-emitting diode unit 208 of the first and the second light-emitting diode groups 202, 204 comprises the hot/cold factor no more than 0.9, preferably no more than 0.85, and further preferably no more than 0.8, and comprises a light-emitting diode capable of emitting visible or invisible wavelength, such as red, blue or Ultraviolet wavelength light-emitting diodes, or formed by AlGaInP-based material, or GaN-based material. The hot/cold factor means the ratio of the light output power of the light-emitting diode at a first temperature (for example, T=80° C.) to the light output power of the light-emitting diode at a second temperature less than the first temperature (for example, T=20° C.). The light output power is normalized and the light output power of the light-emitting diode at T=20° C. is defined 100 (or 1).

In the embodiment, the second light-emitting diode group 204 is electrically connected to the thermistor 206 in parallel. The first light-emitting diode group 202 has an equivalent internal resistance $R_1$, the second light-emitting diode group 204 has an equivalent internal resistance $R_2$, and the thermistor 206 has a resistance $R_{PTC}$, wherein $R_1$ and $R_2$ decrease when the temperature is increased. As shown in FIG. 1, when the light-emitting diode unit 208 is the red light or the blue light light-emitting diode, and T is increased from 20° C. to 80° C. $R_1$ and $R_2$ respectively decreases about 7~8%. The resistance $R_{PTC}$ of the thermistor 206 with positive temperature coefficient of resistance has a correlation with the temperature, that is, $R_{PTC}$ increases in the linear or the non-linear correlation when the temperature is increased. During the operation of the light-emitting device 200, an electric current $I_1$ of about 20~1000 mA flowing through the first light-emitting diode group 202 is divided into $I_2$ flowing through the second light-emitting diode group 204 and $I_3$ flowing through the thermistor 206, wherein $I_1=I_2+I_3$. In addition, the potential difference of the two terminals of the second light-emitting diode group 204 is equal to the potential difference of the two terminals of the thermistor 206. Namely, $I_3*R_{PTC}=I_2*R_2$. From the above two relationships, the electric current $I_2$ flowing through the second light-emitting diode group 204 is positive-correlated to $R_{PTC}/(R_2+R_{PTC})$. Namely, $I_2$ is respectively positive-correlated to $R_{PTC}$ and negative-correlated to $R_2$. In the embodiment, the temperature of the light-emitting device 200 is increased during operation. For example, the resistance $R_{PTC}$ of the thermistor 206 is increased due to the increase of the temperature, and the resistance $R_2$ of the second light-emitting diode group 204 is decreased due to the increase of the temperature when the temperature is increased from the initial operation temperature (second temperature) of 20° C. to the steady state temperature (first temperature) of 80° C. Therefore, under the constant electric current $I_1$, the electric current $I_2$ flowing through the second light-emitting diode group 204 is increased, and the light output power of the second light-emitting diode group 204 is increased due to the increase of $I_2$. In other words, the light output power of the second light-emitting diode group 204 can be controlled by $R_{PTC}$ to reduce the decline of the light output power of the second light-emitting diode group 204 caused by hot/cold factor when the temperature is increased, and the function of the temperature compensation is achieved. In addition, the decline of the light output power of the light-emitting device caused by hot/cold factor during the increase of the temperature can be offset or controlled by adjusting the quantity of the light-emitting diode units of the first light-emitting diode group and the second light-emitting diode group, or selecting the thermistor with suitable temperature coefficient of resistance. It is noted that the temperature can be a junction temperature or an environment temperature, and the junction temperature is equal to the environment temperature at a steady state.

In one embodiment, the first light-emitting diode group 202 is capable of emitting blue light having a wavelength of 450-490 nm and the second light-emitting diode group 204 is capable of emitting red light having a wavelength of 610-650 nm. The light-emitting diode unit 208 in the first light-emitting diode group 202 comprises the hot/cold factor greater than 0.85, and the light-emitting diode unit 208 in the second light-emitting diode group 204 comprises the hot/cold factor less than 0.85.

Figure 2B:
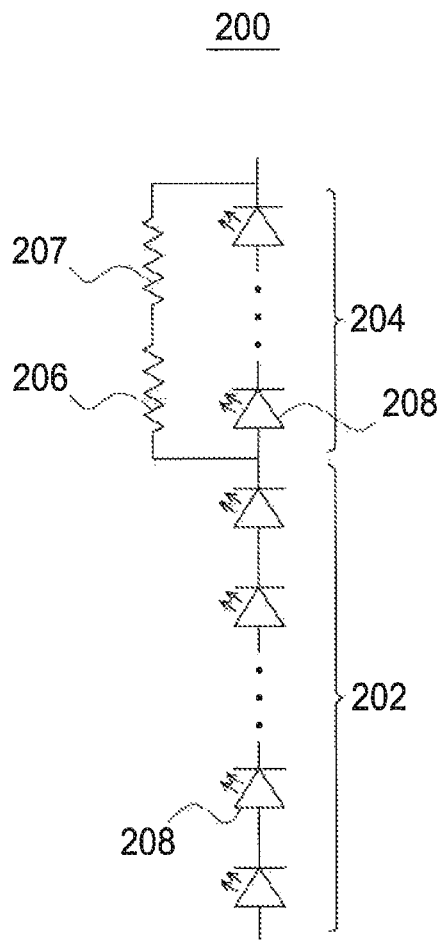
FIG. 2B is a diagram of the light-emitting device in accordance with the second embodiment of the present application.

FIG. 2B illustrates an electric circuit diagram of the light-emitting device in accordance with the second embodiment of the present application. The first light-emitting diode group 202 is capable of emitting blue light having a wavelength of 450-490 nm and the second light-emitting diode group 204 is capable of emitting red light having a wavelength of 610-650 nm. The temperature compensation element comprises a first resistor 206 and a second resistor 207. In this embodiment, the first resistor 206 is connected with the second light-emitting diode group 204 in parallel. The second resistor 207 is electrically connected with the first resistor 206 in series and connected to the second light-emitting diode group 204 in parallel. In this embodiment, the first resistor 206 such as a thermistor has a first temperature coefficient of resistance and the resistor 207 has a second temperature coefficient of resistance, and the absolute value of the first temperature coefficient of resistance is ten times greater than that of the second temperature coefficient of resistance. In addition, the first and second temperature coefficients of resistance are positive. In one embodiment, the first resistor 206 has a first resistance and the second resistor 207 has a second resistance. The first resistance is less than the second resistance. Depending on the actual requirements, the first resistance can be greater than or equal to the second resistance.

It is noted that the light-emitting device 200 has a first color temperature at the first temperature and a second color temperature at the second temperature less than the first temperature. A difference of the first and second color temperatures is less than 300 K while the light intensity of the light-emitting device 200 is larger than 800 lm. The first color temperature is greater than the second color temperature. A difference between the first temperature and the second temperature is greater than 20 degrees Celsius.

Figure 3:
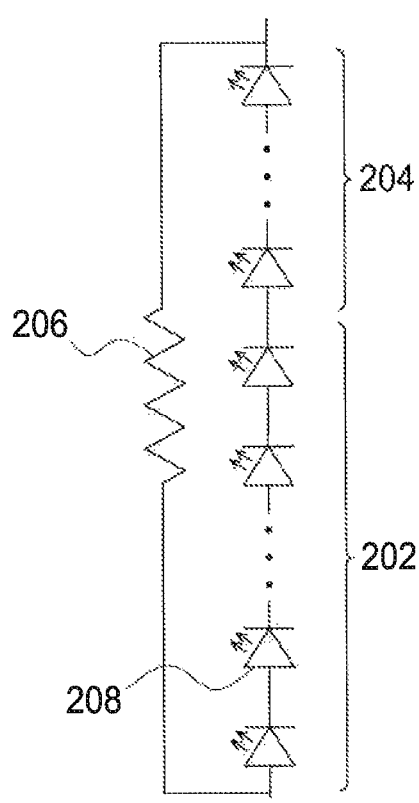
FIG. 3 is a diagram of the light-emitting device in accordance with the third embodiment according of the present application.

As shown in FIG. 3, the thermistor 206 with positive temperature coefficient of resistance of the third embodiment can be electrically connected to the first light-emitting diode group 202 and the second light-emitting diode group 204 in parallel at the same time. Thus, when the temperature of the light-emitting device is increased, the electric current flowing through the first light-emitting diode group 202 and the second light-emitting diode group 204 is increased compared with that at the initial temperature.

Figure 4:
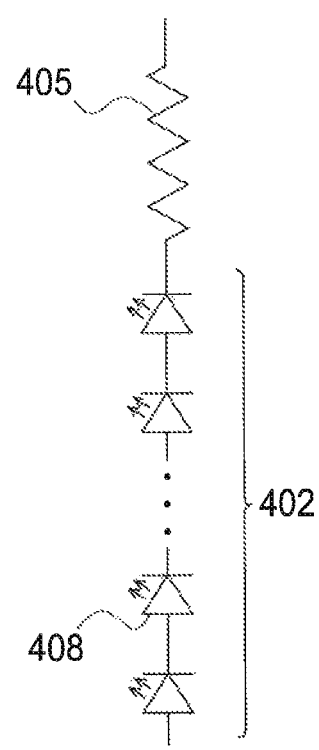
FIG. 4 is a diagram of the light-emitting device in accordance with the fourth embodiment of the present application.

FIG. 4 is an electric circuit diagram of the light-emitting device in accordance with the fourth embodiment of the present application. The light-emitting device 400 comprises a light-emitting diode group 402 and a thermistor 405 with negative temperature coefficient of resistance (NTC). The light-emitting diode group 402 comprises a plurality of light-emitting diode units 408 connected to one another in series. The light-emitting diode group 402 comprises the light-emitting diode capable of emitting visible or invisible wavelength, such as red, blue or ultraviolet wavelength light-emitting diodes, or formed by AlGaInP-based material, or GaN-based material.

In the embodiment, the light-emitting diode group 402 and the thermistor 405 are electrically connected in series. The light-emitting diode group 402 has an equivalent internal resistance $R_1$, and the thermistor 405 has a resistance $R_{NTC}$, wherein $R_1$ decreases when the temperature is increased. As shown in FIG. 1, when the light-emitting diode unit 408 is the red light or the blue light light-emitting diode, and T is increased from 20° C. to 80° C., $R_1$ decreases about 7~8%. The resistance $R_{NTC}$ of the thermistor 405 with negative temperature coefficient of resistance has a correlation with the temperature, that is, $R_{NTC}$ decreases in the linear or the non-linear relationship when the temperature is increased. When the light-emitting device 400 is operated under the constant electric voltage, the electric current $I_1$ flowing through the light-emitting diode group 402 is about 20~1000 mA under the input $V_{in}$ of constant electric voltage. According to Ohm's law, the electric current $I_1$ is inversely proportional to the total resistance of the light-emitting device 400 and the thermistor 405, that is, $I_1=V_{in}/(R_1+R_{NTC})$. In other words, the electric current $I_1$ flowing through the light-emitting diode group 402 is negative-correlated to $R_{NTC}$ and $R_1$. In the embodiment, the temperature of the light-emitting device 400 is increased during operation. For example, the resistance $R_{NTC}$ of the thermistor 405 and the resistance $R_1$ of the light-emitting diode group 402 are decreased due to the increase of the temperature when the temperature is increased from the initial operation temperature (second temperature) of 20° C. to the steady state temperature (first temperature) of 80° C. Thus, $I_1$ is increased, and the light output power of the light-emitting diode group 402 is increased due to the increase of $I_1$. In other words, the light output power of the light-emitting diode group 402 can be controlled by the $R_{NTC}$ to reduce the decline of the light output power of the light-emitting diode group 402 caused by hot/cold factor when the temperature is increased, and the function of the temperature compensation is achieved. In addition, the decline of the light output power of the light-emitting device caused by hot/cold factor during the increase of the temperature can be reduced by adjusting the quantity of the light-emitting diode units of the light-emitting diode group 402, and/or selecting the thermistor with suitable temperature coefficient of resistance. It is noted that the temperature can be a junction temperature or an environment temperature, and the junction temperature is equal to the environment temperature at a steady state.

Figure 5:
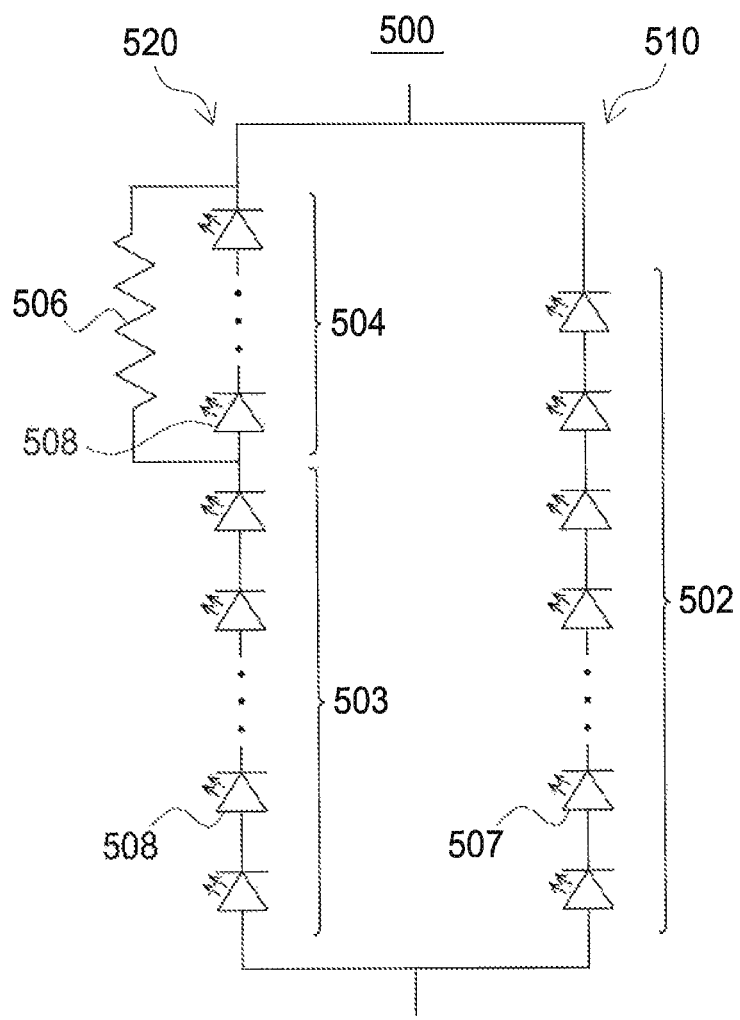
FIG. 5 is a diagram of the light-emitting device in accordance with the fifth embodiment of the present application.

FIG. 5 is an electric circuit diagram of the light-emitting device in accordance with the fifth embodiment of the present application. The light-emitting device 500 comprises a first light-emitting module 510, a second light-emitting module 520 connected to the first light-emitting module 510 in parallel, and a thermistor 506 with positive temperature coefficient of resistance electrically connected to the second light-emitting module 520. The first light-emitting module 510 comprises a first light-emitting diode group 502, and the second light-emitting module 520 comprises a second light-emitting diode group 503 and a third light-emitting diode group 504. The first light-emitting diode group 502 comprises a first quantity of the first light-emitting diode units 507 connected to one another in series, the second light-emitting diode group 503 comprises a second quantity of the second light-emitting diode units 508 connected to one another in series, and the third light-emitting diode group 504 comprises a third quantity of the second light-emitting diode units 508 connected to one another in series. The thermistor 506 is electrically connected to the third light-emitting diode group 504 in parallel, and electrically connected to the second light-emitting diode group 503 in series. The first light-emitting module 510 or the first light-emitting diode unit 507 has the hot/cold factor more than 0.85; the second light-emitting module 520 or the second light-emitting diode unit 508 has the hot/cold factor less than that of the first light-emitting module 510 or the first light-emitting diode unit 507, for example less than 0.85, or preferably less than 0.8. In the embodiment, the first light-emitting diode unit comprises the blue light light-emitting diode emitting blue light having a wavelength of 450-490 nm with the hot/cold factor about 0.88, and the second light-emitting diode unit comprises the red light light-emitting diode emitting red light having a wavelength of 610-650 nm with the hot/cold factor about 0.63. Other visible or invisible wavelength light-emitting diode can also be included, such as green, yellow or ultraviolet wavelength light-emitting diodes, or formed by AlGaInP-based material, or GaN-based material.

In the embodiment, the third light-emitting diode group 504 is electrically connected to the thermistor 506 in parallel. The second light-emitting diode group 503 has an equivalent internal resistance $R_1$, the third light-emitting diode group 504 has an equivalent internal resistance $R_2$, and the thermistor 506 has a resistance $R_{PTC}$, wherein $R_1$ and $R_2$ decrease when the temperature is increased. As shown in FIG. 1, when the second light-emitting diode unit is the red light or the blue light light-emitting diode, $R_1$ and $R_2$ respectively decreases about 7~8%. The resistance $R_{PTC}$ of the thermistor 506 with positive temperature coefficient of resistance has a correlation with the temperature, that is, $R_{PTC}$ increases in the linear or the non-linear correlation when the temperature is increased. During the operation of the light-emitting device 500, an electric current $I_0$ is divided into $I_1$ flowing through the first light-emitting module 510 and $I_2$ flowing through the second light-emitting module 520. The electric current $I_2$ flowing through the third light-emitting diode group 504 and the thermistor 506 of the second light-emitting module 520 is divided into $I_3$ flowing through the third light-emitting diode group 504 and $I_4$ flowing through the thermistor 506, wherein $I_2=I_3+I_4$. In addition, the potential difference of the two terminals of the third light-emitting diode group 504 is equal to the potential difference of the two terminals of the thermistor 506. Namely, $I_4*R_{PTC}=I_3*R_2$. From the above two relationships, the electric current $I_3$ flowing through the third light-emitting diode group 504 is positive-correlated to $R_{PTC}/(R_2+R_{PTC})$. Namely, $I_3$ is positive-correlated to $R_{PTC}$ and negative-correlated to $R_2$. In the embodiment, the temperature of the light-emitting device 500 is increased during operation. For example, the resistance $R_{PTC}$ of the thermistor 506 is increased due to the increase of the temperature, and the resistance $R_2$ of the third light-emitting diode group 504 is decreased due to the increase of the temperature when the temperature is increased from the initial operation temperature (second temperature) 20° C. to the steady state temperature (first temperature) 80° C. Therefore, $I_3$ increases due to the increase of the temperature and the light output power of the third light-emitting diode group 504 also increases due to the increase of $I_3$. In the embodiment, the hot/cold factor of the first light-emitting module 510 is larger than that of the second light-emitting module 520, so the decline of the light output power of the second light-emitting module 520 is larger than that of the first light-emitting module 510 when the temperature is increased. Thus, the light color mixed by the light emitted from the first light-emitting module 510 and the light emitted from the second light-emitting module 520 shifts to the light color emitted from the first light-emitting module 510 when the temperature is increased. But the decline of the light output power of the second light-emitting module 520 caused by hot/cold factor can be reduced when the temperature is increased by controlling the $R_{PTC}$ of the thermistor 506, and the function of the temperature compensation can be achieved. In addition, the decline of the light output power of the second light-emitting module 520 caused by hot/cold factor during the increase of the temperature can be offset or controlled by adjusting the quantity of the light-emitting diode units of the second light-emitting diode group and the third light-emitting diode group, or selecting the thermistor with suitable temperature coefficient of resistance. Furthermore, the thermistor 506 of the embodiment can be electrically connected to the second light-emitting diode group 503 and the third light-emitting diode group 504 in parallel at the same time. Thus, when the temperature of the light-emitting device is increased, the electric current flowing through the second light-emitting diode group 503 and the third light-emitting diode group 504 is increased compared with that at the initial temperature.

Figure 6:
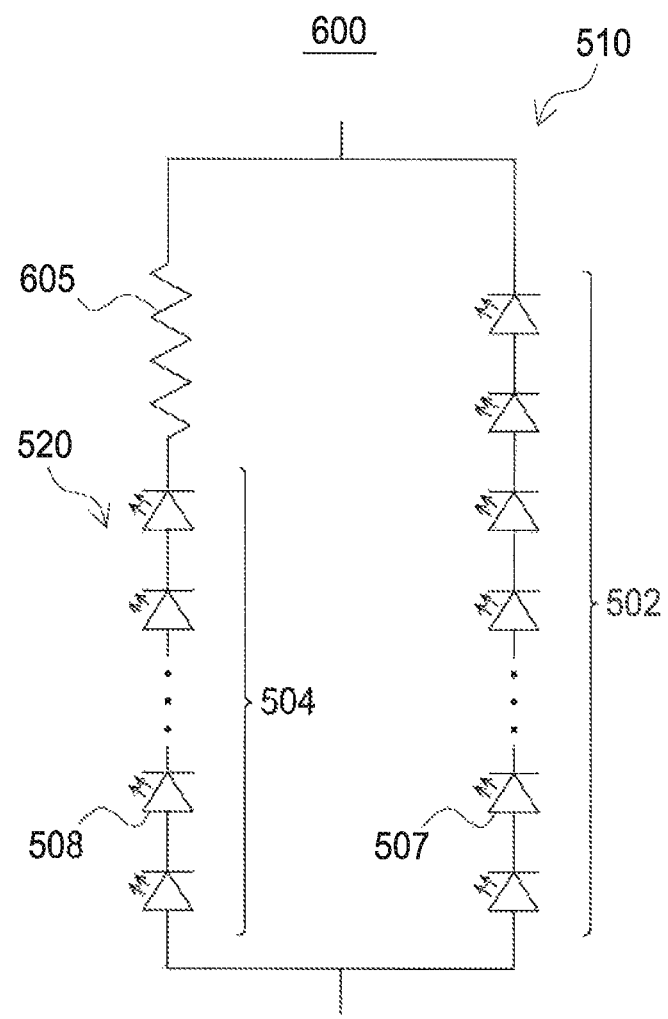
FIG. 6 is a diagram of the light-emitting device in accordance with the sixth embodiment of the present application.

The sixth embodiment of the present application is illustrated in FIG. 6. The difference between the sixth and the fifth embodiments is that the second light-emitting module 520 is connected to the thermistor 605 with negative temperature coefficient of resistance in series. Based on the related description similar to the fourth embodiment and the fifth embodiment, the function of temperature compensation of the present application is achieved. In addition, the first light-emitting module and the second light-emitting module of the above-described fifth and sixth embodiments are not limited to be connected in parallel, and each of them also can be connected to an independent control current source or voltage source.

Figure 6A:
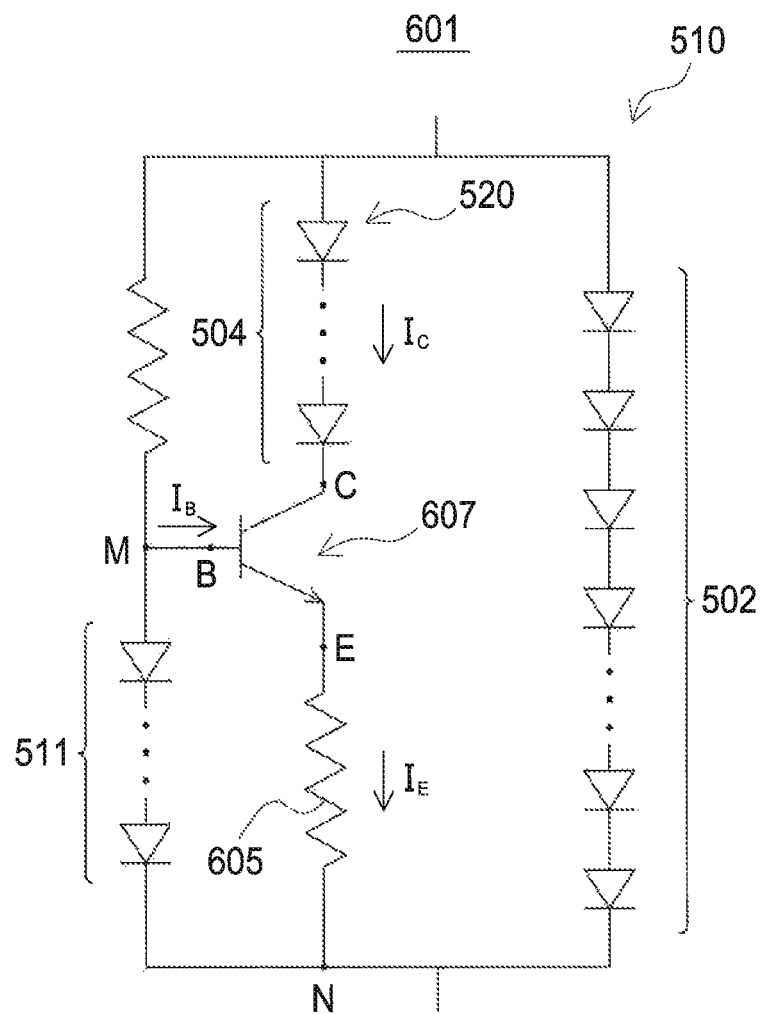
FIG. 6A is a diagram of a light emitting device in accordance with another embodiment of the present application.

FIG. 6A illustrates a light emitting device 601 of another embodiment of the present application. The light emitting device comprises a first light-emitting module 510, a second light-emitting module 520, a thermistor 605 (temperature compensation element) and a switch device 607. In this embodiment, the first light-emitting module 510 comprises a first light-emitting diode group 502 and the second light-emitting module 520 comprises a second light-emitting diode group 504. The first light-emitting diode group 502 emits blue light having a peak wavelength of 450-490 nm, and the second light-emitting diode group 504 emits red light having a peak wavelength of 600-650 nm. The hot/cold factor of the second light-emitting module 520 is less than that of the first light-emitting module 510. In other words, the temperature coefficient of light output of the second light-emitting module 520 is higher than that of the first light-emitting module 510. The first light-emitting module 510 is electrically connected to the second light-emitting module 520 in parallel. The second light-emitting module 520 is connected to the thermistor 605 having a resistance (R_NTC) with negative temperature coefficient in series. The switch device 607 is electrically connected between the second light-emitting module 520 and the thermistor 605. In this embodiment, the switch device 607 is a bipolar junction transistor (BJT) and thus the current ($I_C$) through the second light-emitting diode group 504 is substantially equal to the current ($I_E$) through the thermistor 605. Specifically, the bipolar junction transistor (BJT) has three nodes: emitter (node E), collector (node C), and base (node B). The node C is connected to the second light-emitting diode group 504, and the node E is connected to the thermistor 605. A voltage regulating device 511 is connected between node M and node N. The voltage of node M is equal to that of node B. It is noted that the voltage ($V_{MN}$) between node M and node N applied to the voltage regulating device 511 is equal to the voltage between node B and node N including a junction voltage ($V_{BE}$) between node B and node E and a voltage ($V_{R\_NTC}$) across the thermistor 605, that is $V_{MN}=V_{BE}+V_{R\_NTC}$. For example, the voltage regulating device 511 comprises two silicon-based diodes such that $V_{MN}=1.4V$; and the junction voltage is $V_{BE}=0.7V$ while the BJT is silicon transistor. Namely, $V_{R\_NTC}=1.4V-0.7V=0.7V$. According to Ohm's law $V_{R\_NTC}=I_E*R\_NTC$, the current $I_E$ can be adjusted and decided by $V_{R\_NTC}$ and R_NTC. Likewise, due to $I_C \approx I_E$ the current ($I_C$) through the second light-emitting diode group 504 is also decided by $V_{R\_NTC}$ and R_NTC. Alternatively, the switch device 607 can comprise power bipolar junction transistor, hetero-bipolar junction transistor (BJT), metal-oxide-semiconductor field-effect transistor (MOSFET), power metal-oxide-semiconductor field-effect transistor, high electron mobility transistor (HEMT), silicon controlled rectifier (SCR), insulated gate bipolar transistor (IGBT), or combinations thereof.

For example, referring to FIG. 6A, the light-emitting device 601 is operated under the constant voltage. During the operation of the light-emitting device 601 at temperature of 20° C., the electric current $I_{1(20°\ C.)}$ flowing through the first light-emitting diode group 502 is about 20~1000 mA under the input $V_{in}$ of constant electric voltage and the electric current $I_{C(20°\ C.)}$ ($\approx I_{E(20°\ C.)}$) flowing through the second light-emitting diode group 504 and the thermistor 605 is about 20~1000 mA under the input $V_{in}$ of constant electric voltage. Since the second light-emitting diode group 504 is connected in series with the switch device 607 and the thermistor 605, the input $V_{in}$ of constant electric voltage is a total voltage of the forward voltage ($V_{LED}$) of the second light-emitting diode group 504, the voltage ($V_{CE}$) between the node C and node E, and the voltage ($V_{R\_NTC}$) of the thermistor 605, that is, $V_{in}=V_{LED}+V_{CE}+V_{R\_NTC}$.

It is noted that since the thermistor 605 has a resistance (R_NTC) with negative temperature coefficient, the resistance $R_{NTC}$ of the thermistor 605 decreases as the temperature increases. Though the voltage of the voltage regulating device 511 also decreases with temperature, its variation is much less than that of the thermistor 605. Therefore, at temperature of 80° C., a net increase in the ($I_{E(80°\ C.)}$) through the thermistor 605 is readily obtained, that is, the current though the thermistor 605 at temperature of 80° C. is greater than that at temperature of 20° C. Furthermore, since the current ($I_C$) through the second light-emitting diode group 504 is substantially equal to the current ($I_E$), the current ($I_C$) also increases, that is, the current though the second light-emitting diode group 504 at temperature of 80° C. is greater than that at temperature of 20° C. Accordingly, the decrement of the light output of the second light-emitting group 504 due to smaller hot/cold factor (or the larger temperature coefficient) can be reduced even eliminated such that a relatively steady ratio of red light output of the second light-emitting group 504 to blue light output of the first light-emitting group 502 can be maintained at different temperatures, and resulting in a stable color temperature at different temperatures.

Figure 6B:
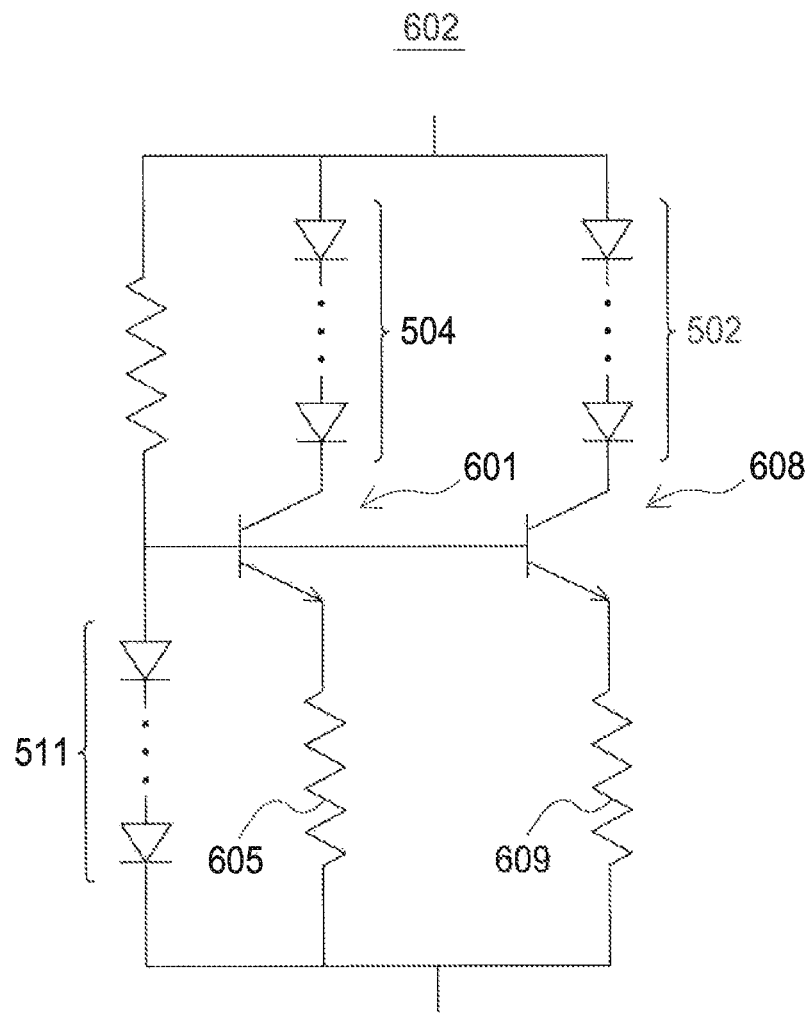
FIG. 6B is a diagram of a light emitting device in accordance with another embodiment of the present application.

In this embodiment, the switch device 607 functions to regulate the current through the second light-emitting diode group 504 while under operation. That is, while voltage is varied in a desired range, the current can be controlled within a designated range. Specifically, during manufacturing, the forward voltage ($V_{LED}$) of the second light-emitting diode group 504 may deviate from a predetermined value. However, because of the switch device 607, an offset voltage is applied to the switch device 607. Therefore, there is no need to individually adjust the thermistor 605 from this LED group to another LED group so as to maintain the same operation current through the second light-emitting diode group 504 by virtue of the switch device 607. In addition, from 20° C. to 80° C., since the forward voltage ($V_{LED}$) of the second light-emitting diode group 504 decreases, this additional voltage variation ($\Delta V=V_{LED(20°\ C.)}-V_{LED(80°\ C.)}$) from the second light-emitting diode group 504 also applies to the switch circuit 607 without affecting the voltage across the thermistor 605. Furthermore, due to this circuit configuration, the current ($I_C$) through the second light-emitting diode group 504 is mainly determined by the voltage regulating device 511. Accordingly, by virtue of the switch device 607, the predetermined current can be obtained at different temperatures. FIG. 6B illustrates a light emitting device 602 of another embodiment of the present application. The light emitting device 602 has an electrical circuit similar to that of the light emitting device 601. A switch device 608 and a resistor 609 are electrically connected to the first light-emitting diode group 502. The switch device 608 is disposed between the first light-emitting diode group 502 and the resistor 609. Likewise, due to this circuit configuration, the current through the first light-emitting diode group 502 as well as the current through the second light-emitting diode 504 are mainly determined by the voltage regulating device 511. In addition, by virtue of the switch device 608, when the forward voltage of the first light-emitting diode group 502 decreases as temperature increases, the extra voltage variation ($\Delta V=V_{LED(20°\ C.)}-V_{LED(80°\ C.)}$) of the forward voltage of the first light-emitting diode 502 is applied on the switch device 608 and the current still maintains at the same predetermined value. The switch device 608 comprises power bipolar junction transistor, bipolar junction transistor (BJT), hetero-bipolar junction transistor (BJT), metal-oxide-semiconductor field-effect transistor (MOSFET), power metal-oxide-semiconductor field-effect transistor, high electron mobility transistor (HEMT), silicon controlled rectifier (SCR), insulated gate bipolar transistor (IGBT), or combinations thereof. The thermistor 605 has a first temperature coefficient of resistance and the resistor 609 has a second temperature coefficient of resistance; and the absolute value of the first temperature coefficient of resistance is ten times greater than that of the second temperature coefficient of resistance.

Figure 7:
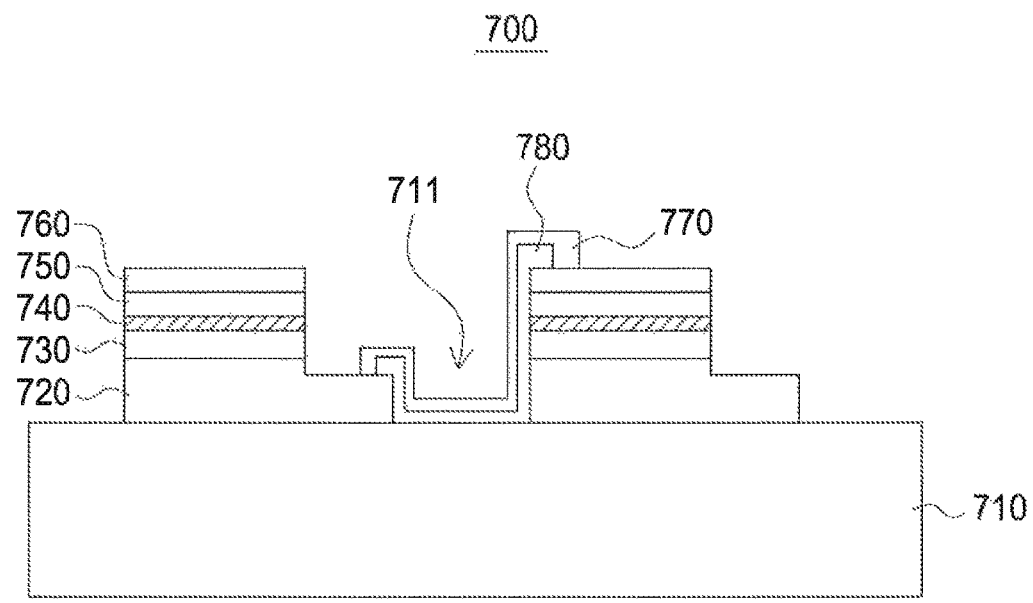
FIG. 7 is a structure diagram of the light-emitting device of a light-emitting diode group according to the above-described embodiments of the present application.

FIG. 7 is a structure diagram of a light-emitting diode group according to the above-described embodiments of the present application. A light-emitting diode group 700 comprises a substrate 710, and a plurality of light-emitting diode units formed or attached to the substrate 710 in an array type, and is divided by a trench 711. Each of the plurality of light-emitting diode units comprises an n-type contact layer 720 formed on the substrate 710, an n-type cladding layer 730 formed on the contact layer 720, an active layer 740 formed on the n-type cladding layer 730, a p-type cladding layer 750 formed on the active layer 740, a p-type contact layer 760 formed on the p-type cladding layer 750, a connecting wire 770 electrically connected to the n-type contact layer 720 of the light-emitting diode unit and the p-type contact layer 760 of another light-emitting diode unit in series, and an insulation layer 780 formed between the trench 711 and the connecting wire 770 to avoid the short circuit path. The n-type cladding layer 730 and p-type cladding layer 750 respectively provide electrons and holes such that electrons and holes can be combined in the active layer 740 to emit light. The contact layer provides an ohmic contact interface between an electrode and the cladding layer. In the embodiment of the present application, the light-emitting diode group 700 comprises a high voltage array-type single chip including the plurality of light-emitting diode units collectively formed on the single substrate, such as the blue light high voltage array-type single chip with the operation voltage between 60-120V or the red light high voltage array-type single chip with the operation voltage between 30-50V, and the operation voltage depends on the quantity of the light-emitting diode units connected in series. The material of the above-described n-type or p-type contact layer, the n-type or the p-type cladding layer, or the active layer comprises the III-V group compound such as $Al_xIn_yGa_{(1-x-y)}N$ or $Al_xIn_yGa_{(1-x-y)}P$, wherein $0 \le x$, $y \le 1$; $(x+y) \le 1$.

Figure 8:
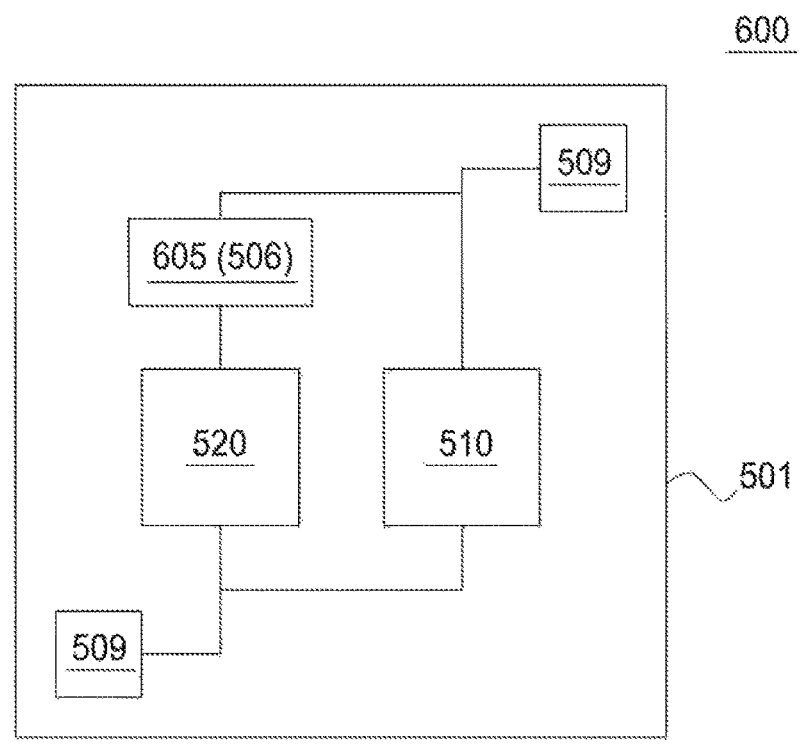
FIG. 8 is a structure diagram of the light-emitting device in accordance with the fifth embodiment or the sixth embodiment of the present application.

FIG. 8 is a structure diagram of the light-emitting device in accordance with the fifth embodiment or the sixth embodiment of the present application. The first light-emitting module 510 of the light-emitting device 600 comprises the blue light high voltage array-type single chip illustrated in FIG. 7, and the second light-emitting module 520 comprising the red light high voltage array-type single chip illustrated in FIG. 7 is electrically connected to a thermistor 506, 605; two electrodes 509 are electrically connected to the first light-emitting module 510 and the second light-emitting module 520 to receive a power signal; the first light-emitting module 510, the second light-emitting module 520, the temperature compensation element (thermistor 506, 605) and the electrode 509 are collectively formed on a board 501.

Figure 9:
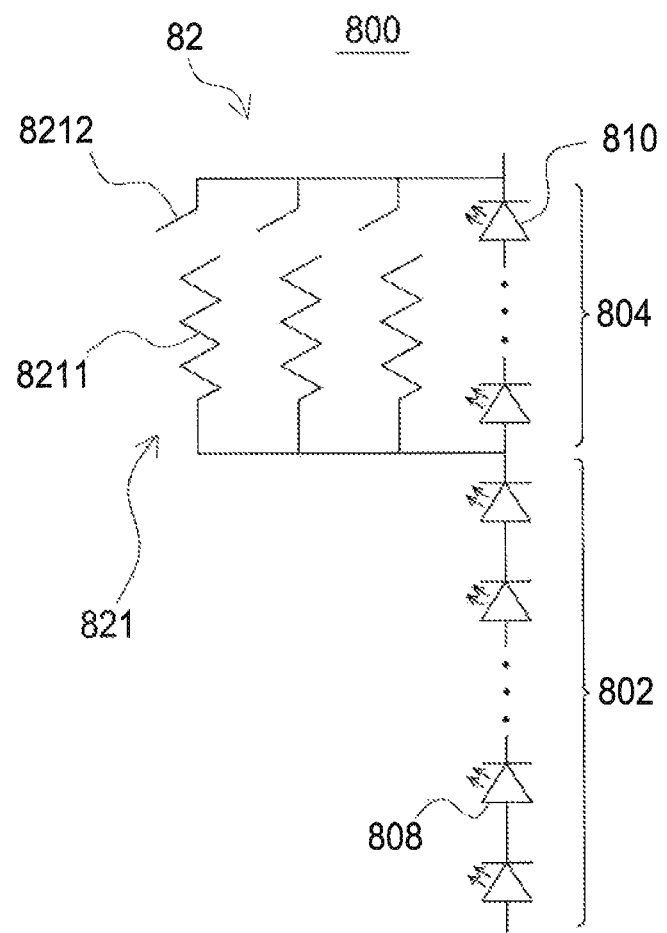
FIG. 9 is a diagram of the light-emitting device in accordance with the seventh embodiment of the present application.

FIG. 9 is an electric circuit diagram of the light-emitting device in accordance with the seventh embodiment of the present application. The light-emitting device 800 comprises a first light-emitting diode group 802 and a second light-emitting diode group 804. The first light-emitting diode group 802 comprises a first quantity of light-emitting diode units 808 connected to one another in series, the second light-emitting diode group 804 comprises a second quantity of light-emitting diode units 810 connected to one another in series, and the first light-emitting diode group 802 is electrically connected to the second light-emitting diode group 804 in series. The light-emitting diode units 808, 810 comprise a light-emitting diode capable of emitting visible or invisible wavelength, such as red, blue or ultraviolet wavelength light-emitting diodes, or formed by AlGaInP-based material, or GaN-based material. In this embodiment, the first light-emitting diode group 802 emits blue light having a wavelength of 450-490 nm, and the second light-emitting diode group 804 emits red light having a wavelength of 610-650 nm. The light-emitting device 800 further comprises a temperature compensation element 82 electrically connected to the second light-emitting diode group 804 in parallel. The temperature compensation element 82 can be operated in an electrical form or a mechanic form. In this embodiment, the temperature compensation element 82 is a mechanic form and comprises a plurality of resistor elements 821. Each of the resistor elements 821 comprises a resistor 8211 and a mechanic switch 8212. The switch 8212 comprises micro-actuator, one-way or two way-shaped memory alloy (SMA), bi-metallic strip, or capillary thermostat switch. The resistor 8211 in each resistor element 821 has the same resistance. In other embodiment, the resistance of the resistors 8211 in each of the resistor elements 821 can be different depending on the actual requirements. The number of the resistor elements 821 can also be varied. A number of the switch can be designed to connected or disconnected with different temperatures.

Figure 10A:
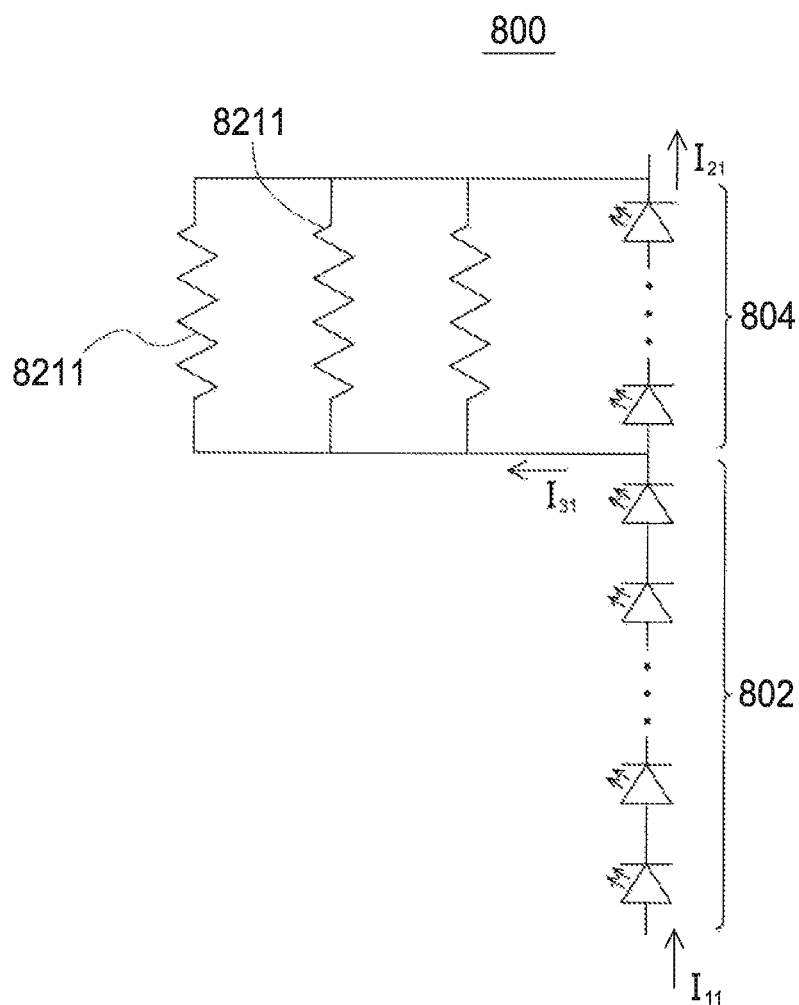
FIGS. 10A-10D are diagrams showing an operation of the light-emitting device in accordance with the seventh embodiment at different temperatures.
Figure 10B:
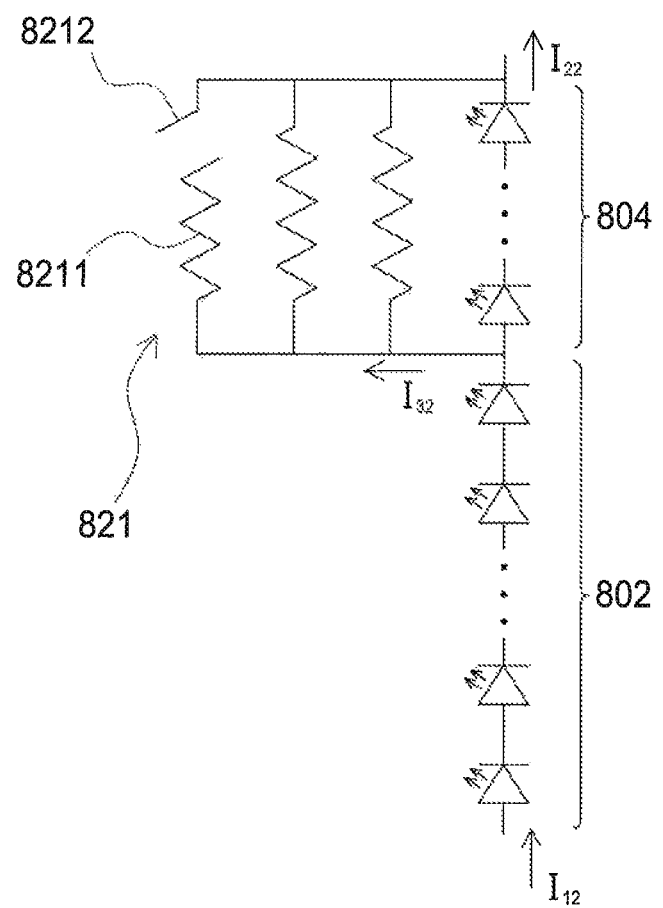
Figure 10C:
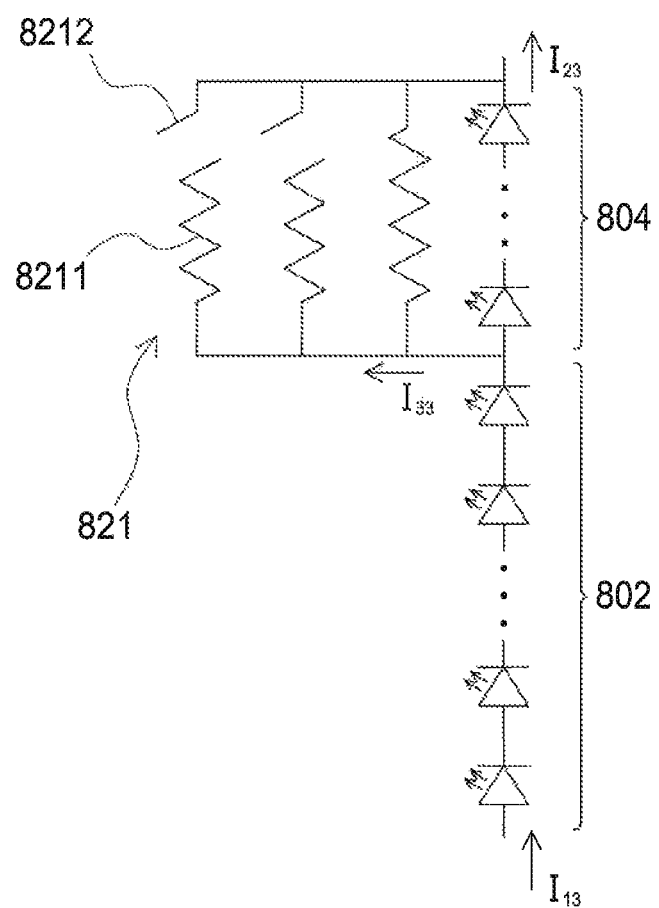
Figure 10D:
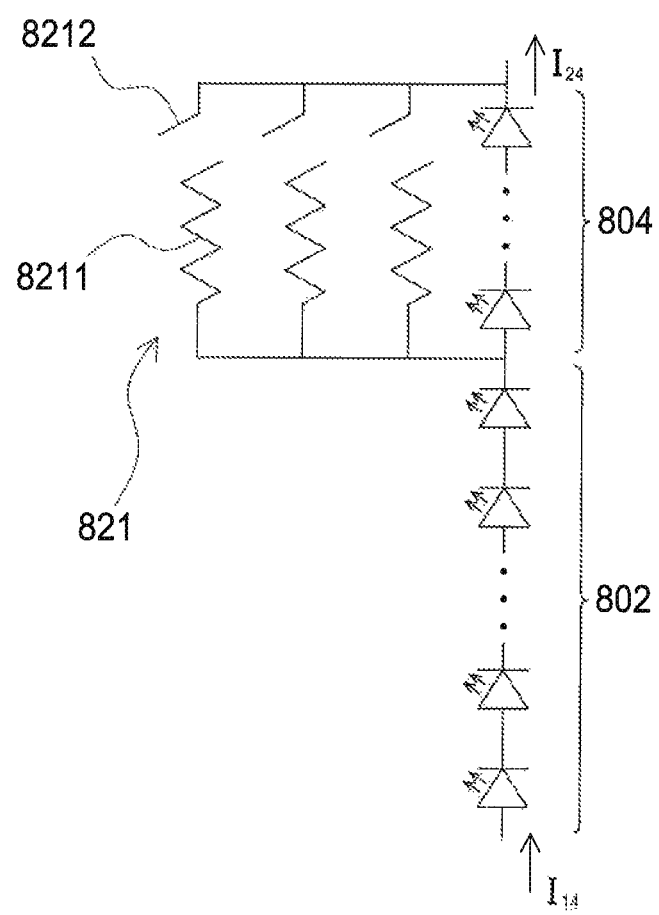

In this embodiment, the switch 8212 is two-way shaped memory alloy. The shape of the shaped memory alloy can deform with different temperature. In a first stage, as shown in FIG. 10A, during the operation of the light-emitting device 800 at temperature of 20° C., the shaped memory alloy is connected to the resistors 8211 such that the resistors 8211 (for example, three resistors are shown in this embodiment) are electrically connected with the second light-emitting diode group 804 in parallel. Therefore, an electric current such as 20~1000 mA flowing through the first light-emitting diode group 802 is divided into $I_{21}$ flowing through the second light-emitting diode group 804 and $I_{31}$ flowing through the temperature compensation element 82, wherein $I_{11}=I_{21}+I_{31}$. In a second stage, as shown in FIG. 10B, at temperature of 40° C., the shape of one shaped memory alloy deforms to disconnected one resistor 8211 with the second light-emitting diode group 804 such that a total resistance of the resistor elements 821 is increased (that is, the resistance of the temperature compensation element is increased), and the electric current $I_{32}$ ($<I_{31}$) flowing therethrough is decreased. Since the electric current $I_{12}$ (=$I_{11}$=$I_{22}$+$I_{32}$.) through the first light-emitting diode group 802 is constant, when the resistance of the temperature compensation element 82 is increased, the electric current $I_{22}$ ($>I_{21}$) through the second light-emitting diode group 804 is increased. Likewise, in a third stage, as shown in FIG. 10C, at temperature of 60° C., the shape of another shaped memory alloy deforms further such that two resistors 8211 are disconnected with the second light-emitting diode group 804 and a total resistance of the resistor elements 821 is further increased (that is, the resistance of the temperature compensation element is further increased) compared to that in FIG. 10B, and the electric current $I_{33}$ ($<I_{32}$) flowing therethrough is further decreased. The electric current $I_{23}$ ($>I_{22}$) through the second light-emitting diode group 804 is further increased. In a fourth stage, as shown in FIG. 10D, at temperature of 80° C., the shapes of three shaped memory alloy deform to disconnected all of the resistors 8211 with the second light-emitting diode group 804 such that the electric current $I_{14}$ (=$I_{11}$=$I_{12}$=$I_{13}$) flowing through the first light-emitting diode group 802 is not divided and flows through the second light-emitting diode group 804 ($I_{24}$>$I_{23}$). By virtue of disconnecting the resistor with the second light-emitting diode group 804, a total resistance of the resistor elements 821 is increased (that is, the resistance of the temperature compensation element is increased), which results in the electric current flowing through the temperature compensation element 82 is decreased and the electric current through the second light-emitting diode group 804 is increased when the electric current through the temperature compensation element 82 and the second light-emitting diode group 804 is constant. Accordingly, the decline of the light output power of the second light-emitting group 804 caused by hot/cold factor can be reduced when the temperature is increased by controlling the total resistance of the temperature compensation element and the function of the temperature compensation can be achieved. It is noted that when the resistance of each resistor element is the same, a first difference between the resistance in the first stage and the resistance in the second stage is less than a second difference between the resistance in the second stage and the resistance in the third stage, and the second difference is less than a third difference between the resistance in the third stage and the resistance in the fourth stage. In other embodiment, the resistance of each resistor element can be different.

Figure 11A:
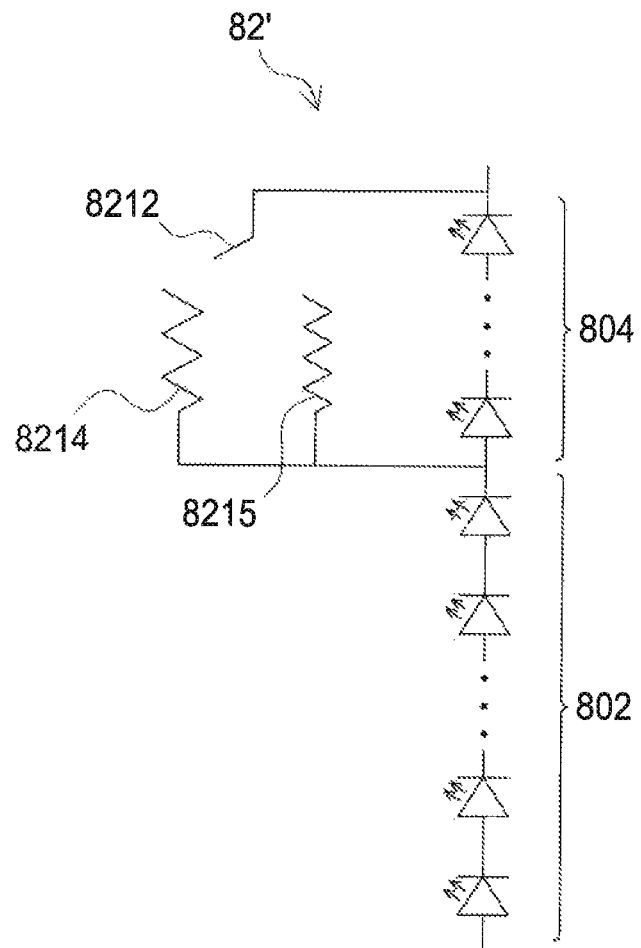
FIGS. 11A-11D are diagrams of the light-emitting device in accordance with the eighth embodiment of the present application.
Figure 11B:
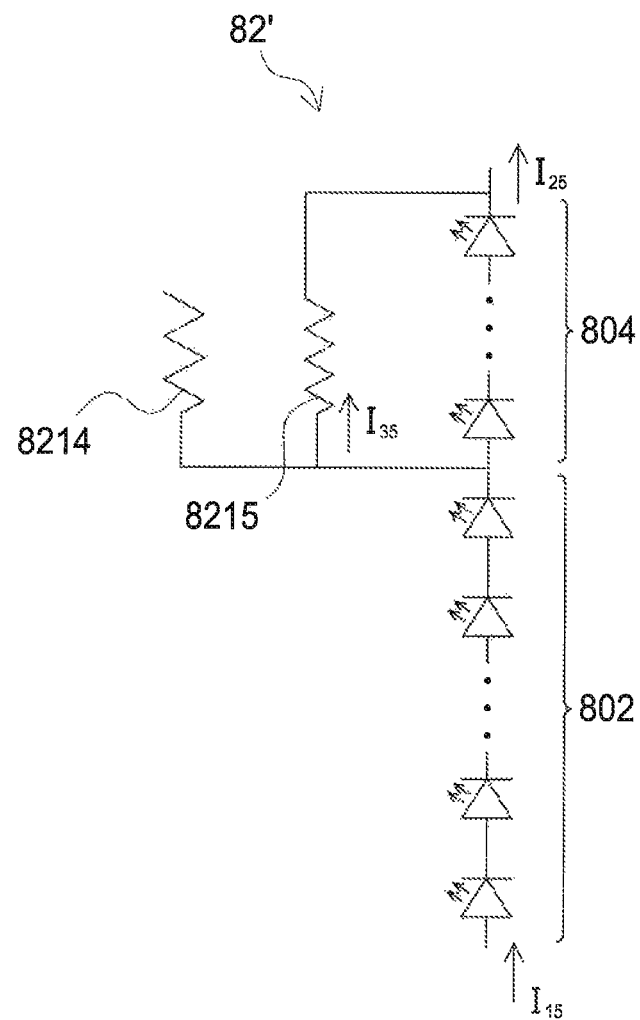
Figure 11C:
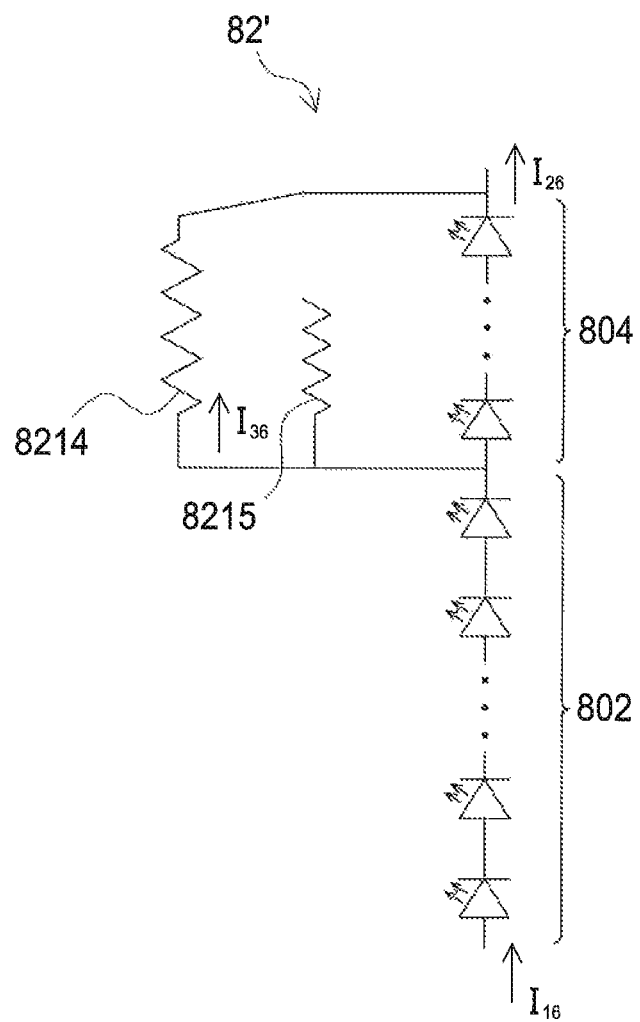

FIGS. 11A-11C are electric circuit diagrams of the light-emitting device in accordance with the eighth embodiment of the present application. As shown in FIG. 11A, a temperature compensation element 82 is electrically connected to the second light-emitting diode group 804 in parallel. The temperature compensation element 82' comprises a first resistor 8214 having a first resistance and a second resistor 8215 having a second resistance less than the first resistance, and a switch 8212. The first resistance at a first temperature is at least two times greater than the second resistance; wherein the first temperature is greater than the second temperature. The switch 8212 is shaped memory alloy. During operation, at temperature of 20° C., as shown in FIG. 11B, the switch 8212 is connected with the second resistor 8215 and disconnected with the first resistor 8214. The electric current $I_{15}$ flowing through the first light-emitting diode group 802 is divided into $I_{25}$ flowing through the second light-emitting diode group 804 and $I_{35}$ flowing through the second resistor 8215, wherein $I_{15}=I_{25}+I_{35}$. At temperature of 50° C., as shown in FIG. 11C, the switch 8212 is deformed in shape to disconnected with the second resistor 8215 and to connect with the first resistor 8214 having the resistance larger than that of the second resistor

Figure 11D:
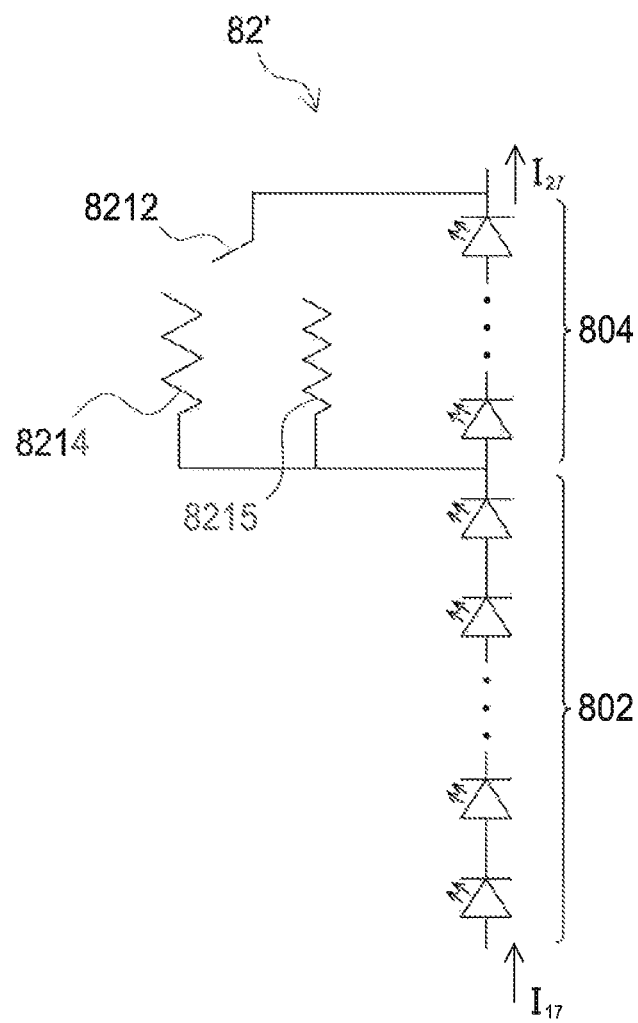

8215. Since an electric current $I_{16}$ (=$I_{15}$=$I_{26}$+$I_{36}$.) through the first light-emitting diode group 802 is constant, when the resistance of the temperature compensation element 82' is increased, the electric current $I_{36}$ (<$I_{35}$) flowing therethrough is decreased. The electric current $I_{26}$ (>$I_{25}$) through the second light-emitting diode group 804 is increased. At temperature of 80° C., as shown in FIG. 11D, the switch 8212 is deformed in shape to disconnected with the first and second resistors 8214, 8215 such that an electric current $I_{17}$ flowing through the first light-emitting diode group 802 is not divided and flows through the second light-emitting diode group 804 ($I_{27}$>$I_{26}$). Accordingly, the decline of the light output power of the second light-emitting group 804 caused by hot/cold factor can be reduced when the temperature is increased by controlling the resistance of the temperature compensation element 82 and the function of the temperature compensation can be achieved.

Figure 12A:
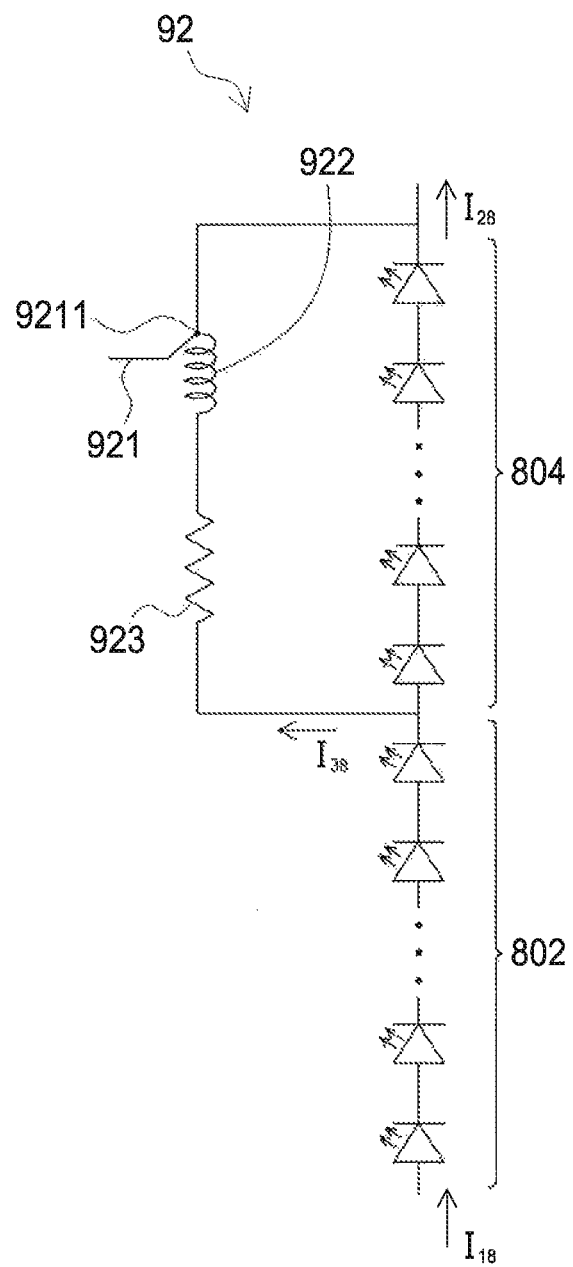
FIGS. 12A and 12B are diagrams of the light-emitting device in accordance with the ninth embodiment of the present application.
Figure 12B:
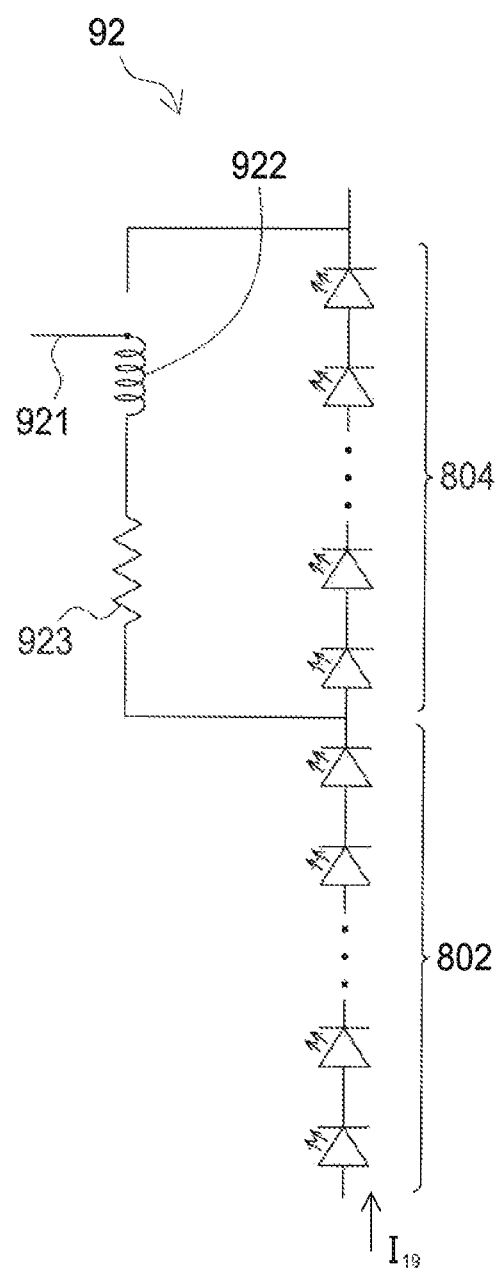

FIGS. 12A and 12B are electric circuit diagrams of the light-emitting device in accordance with the ninth embodiment of the present application. As shown in FIG. 12A, a temperature compensation element 92 comprises a one-way shaped memory alloy 921, a conductive spring 922, and a resistor 923. At temperature of 20° C., the shaped memory alloy 921 has an end fixed with one end of the conductive spring 922 and connected with the second light-emitting diodes group 802 at a node 9211, and the other end of the conductive spring 922 is connected with the resistor 923 such that the resistor is electrically connected with the second light-emitting diodes group 802 in parallel. An electric current $I_{18}$ flowing through the first light-emitting diode group 802 is divided into $I_{28}$ flowing through the second light-emitting diode group 804 and $I_{38}$ flowing through the second resistor 923. At temperature of 80° C. (or 40° C. or 60° C., for example), the shaped memory alloy 921 is deformed to compress the conductive spring 922 such that the conductive spring 922 is disconnected with the resistor 923 as shown in FIG. 12B. Accordingly, the electric current $I_{19}$ flowing through the first light-emitting diode group 802 is not divided and flows through the second light-emitting diode group 804. Subsequently, when the temperature is reduced from 80° C. to 20° C., a restoring force of the conductive spring 922 is provided to force the shaped memory alloy 921 to connect with the second light-emitting diodes group 802, thereby again electrically connecting the resistor 823 with the second light-emitting diodes group 802 in parallel.

Figure 13:
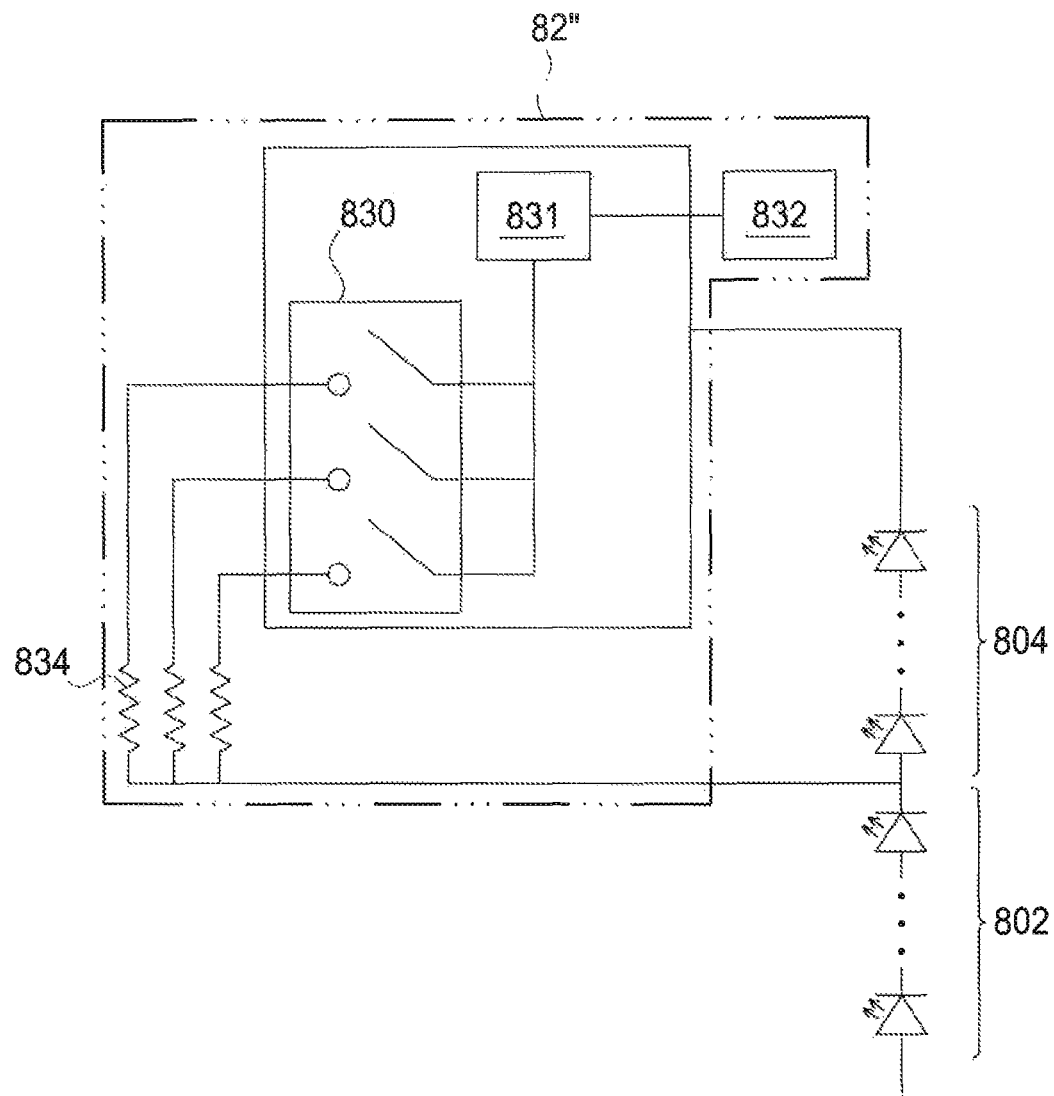
FIG. 13 is a diagram of the light-emitting device in accordance with the tenth embodiment of the present application.

FIG. 13 is an electric circuit diagram of the light-emitting device in accordance with the tenth embodiment of the present application. The temperature compensation element 82" is an electrical form and comprises a temperature sensing unit 832, a temperature detection circuit 831, a switch circuit 830 and a plurality of resistors 834. The switch circuit 830 comprises bipolar junction transistor (BJT), power bipolar junction transistor, hetero-bipolar junction transistor (BJT), metal-oxide-semiconductor field-effect transistor (MOSFET), power metal-oxide-semiconductor field-effect transistor, high electron mobility transistor (HEMT), silicon controlled rectifier (SCR), insulated gate bipolar transistor (IGBT). The temperature sensing circuit 831 and the switch circuit 830 can be integrated to form an integrated circuit. In operation, the temperature sensing unit 832 detects a temperature and transmits a signal to the temperature detection circuit 831. Thereafter, the temperature detection circuit 831 based on the received signal from the temperature sensing unit 832 controls the switch circuit 830 to connect or disconnect the resistors 834 with the second light-emitting diodes group 804. Similar to the seventh embodiment as shown FIGS. 9-10D, at temperature of 20° C., all of the resistors 834 are electrically connected with the second light-emitting diode group 804 in parallel. At temperature of 40° C., one resistor is disconnected with the second light-emitting diode group 804. At temperature of 60° C., two resistors are disconnected with the second light-emitting diode group 804. At temperature of 80° C., all of the resistors are disconnected with the second light-emitting diode group 804.

Figure 14:
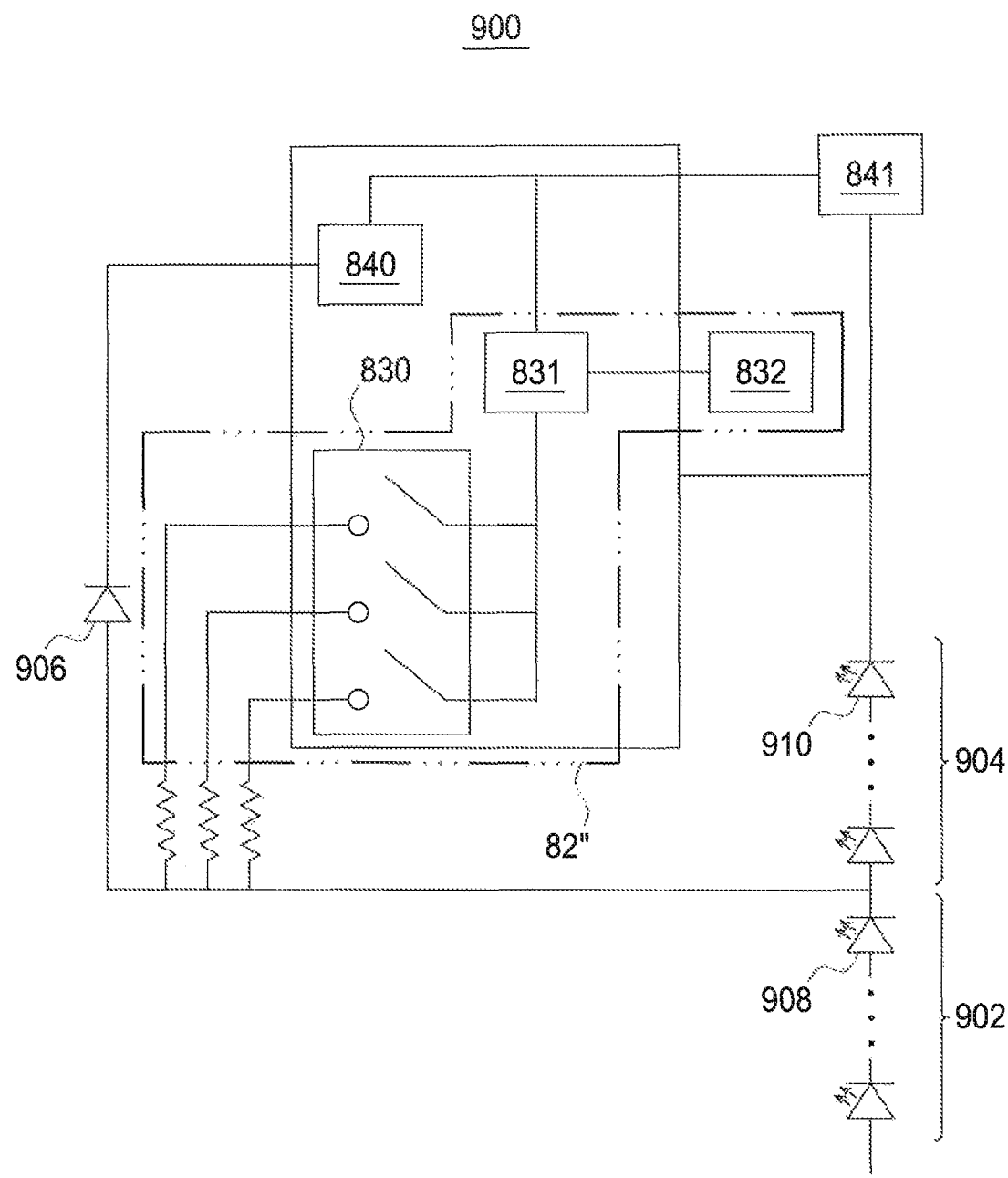
FIG. 14 is a diagram of the light-emitting device in accordance with the eleventh embodiment of the present application.

FIG. 14 is an electric circuit diagram of the light-emitting device in accordance with the eleventh embodiment of the present application. The light-emitting device 900 comprises a first light-emitting diode group 902 and a second light-emitting diode group 904. The first light-emitting diode group 902 comprises a first quantity of light-emitting diode units 908 connected to one another in series, the second light-emitting diode group 904 comprises a second quantity of light-emitting diode units 910 connected to one another in series, and the first light-emitting diode group 902 is electrically connected to the second light-emitting diode group 904 in series. The light-emitting device 900 has the similar structure with the light-emitting device of the tenth embodiment. The light-emitting device 900 further comprises a light-emitting unit 906 connected with the second light-emitting diode group 904 in parallel. The light-emitting diode units 906, 908, 910 comprises a light-emitting diode capable of emitting visible or invisible wavelength, such as red, blue or ultraviolet wavelength light-emitting diodes, or formed by AlGaInP-based material, or GaN-based material. The light-emitting device 900 comprises the temperature compensation element 82" and a current detection unit 841, a current detection circuit 840. The current detection unit 841 detects the current flowing through the second light-emitting diode group 904 and transmits a current signal to the current detection circuit 840. Thereafter, the current detection circuit 840 based on the received current signal from the current sensing unit 841 controls the light-emitting unit 906 to emit light. In this embodiment, the light-emitting diode units 906, 910 emit a red light, and the light-emitting diode unit 908 emits a blue light. At a current density less than 3 mA, a decay of the light output power of the red light-emitting diode unit is larger than that of the blue light-emitting diode unit. Accordingly, when the current detection unit 841 detects the current through the second light-emitting diode group 904 less than 3 mA, a signal from the current detection unit 841 is transmitted to the current detection circuit 840 to control the light-emitting unit 906 to emit red light. In this embodiment, the temperature compensation element 82" and the current detection circuit 840 can be integrated to form an integrated circuit.

The principle and the efficiency of the present application illustrated by the embodiments above are not the limitation of the present application. Any person having ordinary skill in the art can modify or change the aforementioned embodiments. Therefore, the protection range of the rights in the present application will be listed as the following claims.

What is claimed is:
1. A light-emitting device, comprising:
a first plurality of light-emitting diodes;
a second plurality of light-emitting diodes electrically connected to the first light-emitting diode group in parallel;
a first switch device comprising a first node, a second node, and a third node, and directly connected in series to the second plurality of light-emitting diodes through the first node;

a temperature compensation element electrically connected to the second plurality of light-emitting diodes in series through a direct electrical connection to the third node of the first switch device; and a voltage regulating device connected to the first switch device and the temperature compensation element in parallel via the second node.

2. The light-emitting device as claimed in claim 1, wherein temperature compensation element comprises a thermistor with a negative temperature coefficient of resistance.

3. The light-emitting device as claimed in claim 1, wherein the first plurality of light-emitting diodes is configured to emit light having a peak wavelength of 450-490 nm.

4. The light-emitting device as claimed in claim 1, wherein the second plurality of light-emitting diodes is configured to emit light having a peak wavelength of 600-650 nm.

5. The light-emitting device as claimed in claim 1, wherein the second plurality of light-emitting diodes has one or more hot/cold factors less than that of the first plurality of light-emitting diodes.

6. The light-emitting device as claimed in claim 1, further comprising a board, wherein the first and second plurality of light-emitting diodes and the temperature compensation element are formed on the board.

7. The light-emitting device as claimed in claim 1, further comprising a resistor electrically connected to the first plurality of light-emitting diodes in series, and a second switch device directly connected in series between the resistor and the first plurality of light-emitting diodes.

8. The light-emitting device as claimed in claim 7, wherein the first switch device or the second switch device comprises power bipolar junction transistor, bipolar junction transistor (BJT), hetero-bipolar junction transistor (BJT), metal-oxide-semiconductor field-effect transistor (MOSFET), power metal-oxide-semiconductor field-effect transistor, high electron mobility transistor (HEMT), silicon controlled rectifier (SCR), insulated gate bipolar transistor (IGBT), or combinations thereof.

9. The light-emitting device as claimed in claim 7, wherein the temperature compensation element has a first temperature coefficient of resistance and the resistor has a second temperature coefficient of resistance; and an absolute value of the first temperature coefficient of resistance is ten times greater than that of the second temperature coefficient of resistance.

10. The light-emitting device as claimed in claim 1, wherein the second plurality of light-emitting diodes and the temperature compensation element are substantially passed through by a same current.

11. The light-emitting device as claimed in claim 1, wherein the voltage regulating device has a voltage substantially equal to a cumulated voltage of that the temperature compensation element and the first switch device.

12. The light-emitting device as claimed in claim 1, wherein the first plurality of light-emitting diodes and the second plurality of light-emitting diodes simultaneously emit light.

13. The light-emitting device as claimed in claim 1, wherein the first switch device is configured to control an operating current through the second plurality of light-emitting diodes according to a voltage across the voltage regulating device and the temperature compensation element.

14. The light-emitting device as claimed in claim 1, wherein the voltage regulating device has a voltage drop which is substantially equal to a sum of a first voltage drop between the second node and the third node and a second voltage drop of the temperature compensation element.

* * * * *